United States Patent
Minor et al.

(10) Patent No.: US 9,127,947 B2
(45) Date of Patent: Sep. 8, 2015

(54) STATE ESTIMATOR FOR REJECTING NOISE AND TRACKING AND UPDATING BIAS IN INERTIAL SENSORS AND ASSOCIATED METHODS

(75) Inventors: Mark A. Minor, Salt Lake City, UT (US); Eric A. Johnson, Salt Lake City, UT (US); Stacy J. Morris Bamberg, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 990 days.

(21) Appl. No.: 12/467,881

(22) Filed: May 18, 2009

(65) Prior Publication Data

US 2010/0292943 A1    Nov. 18, 2010

(51) Int. Cl.
*G01R 19/00* (2006.01)
*G01C 21/16* (2006.01)
*G01R 31/28* (2006.01)

(52) U.S. Cl.
CPC ............ *G01C 21/16* (2013.01); *G01R 31/2829* (2013.01)

(58) Field of Classification Search
CPC ............................. G01C 21/16; G01R 31/2829
USPC ........... 702/33, 41, 57, 64–70, 79, 82, 86–89, 702/96, 104–106, 110, 111, 113, 116, 141, 702/142, 179, 180–182, 189–191, 702/193–195; 73/1.37, 1.38, 490, 510, 73/504.02, 1.77; 324/612–614; 701/207, 701/220, 221; 235/105
See application file for complete search history.

(56) References Cited

U.S. PATENT DOCUMENTS

| | | | |
|---|---|---|---|
| 6,292,751 B1 | 9/2001 | Frank | |
| 6,617,750 B2 | 9/2003 | Dummermuth et al. | |
| 6,882,964 B2 * | 4/2005 | Bayard et al. | 702/191 |
| 7,274,504 B2 | 9/2007 | Crane et al. | |
| 7,457,724 B2 * | 11/2008 | Vock et al. | 702/182 |
| 7,481,109 B2 | 1/2009 | Moore et al. | |
| 7,508,384 B2 | 3/2009 | Zhang et al. | |
| 7,840,369 B2 * | 11/2010 | Lee et al. | 702/145 |
| 7,921,716 B2 | 4/2011 | Morris Bamberg et al. | |
| 8,279,412 B2 | 10/2012 | Motzer et al. | |
| 8,583,392 B2 | 11/2013 | Panagas | |
| 2002/0109512 A1 * | 8/2002 | Chia et al. | 324/721 |

(Continued)

FOREIGN PATENT DOCUMENTS

WO    WO 2007/124257    11/2007

OTHER PUBLICATIONS

Saxena, et al., "In Use Parameter Estimation of Inertial Sensors by Detecting Multilevel Quasi-static States". KES 2005, LNAI 3684, pp. 595-601, 2005.

(Continued)

*Primary Examiner* — Sujoy Kundu
*Assistant Examiner* — Ricky Ngon
(74) *Attorney, Agent, or Firm* — Workman Nydegger (57) ABSTRACT

A method and system for tracking and updating bias in an inertial sensor by determining a maximum bias drift and a noise band for a sensor, determining a prior bias value of the sensor, and measuring a current bias value of the sensor. The method and system can further include calculating a bias difference between the prior bias value and the current bias value, and updating the prior bias value with the current bias value if the current bias value is within the noise band and the bias difference is less than or equal to the maximum bias drift.

21 Claims, 9 Drawing Sheets

(56) References Cited

U.S. PATENT DOCUMENTS

| | | | |
|---|---|---|---|
| 2006/0072634 A1 | 4/2006 | Daiber | |
| 2007/0032951 A1 | 2/2007 | Tanenhaus et al. | |
| 2008/0188909 A1* | 8/2008 | Bradley | 607/59 |
| 2010/0204615 A1* | 8/2010 | Kyle et al. | 600/595 |
| 2010/0292943 A1 | 11/2010 | Minor et al. | |
| 2012/0022780 A1 | 1/2012 | Kulik et al. | |
| 2012/0203487 A1 | 8/2012 | Johnson et al. | |

OTHER PUBLICATIONS

Tom Ford et al., "MEMS Inertial on an RTK GPS Receiver: Integration Options and Test Results". 12 pages, 2002.

Peter Rizun, "Optimal Wiener Filter for a Body Mounted Inertial Attitude Sensor" The Journal of Navigation (2008), 61, 455-472.

Armesto et al., "The International Journal of Robotics Research", The International Jouranl of Robotics Research 2007; 26; 577. 14 pages. Download from http://ijr.sagepub.com at Univ of Utah on Apr. 7, 2009.

Weinberg et al., "Tilt Determination in MEMS Inertial Vestibular Prosthesis" Journal of Biomechanical Engineering. Dec. 2006, vol. 128 pp. 943-956.

Jurman et al., "Calibration and data fusion solution for the miniature attitude and heading references system". Sensors and Actuators A 138 (2007) 411-420.

Oskiper et al., "Visual Ododmetry System Using Multiple Stereo Cameras and Inertial Measurement Unit". 2007 IEEE. 8 pages.

Z.J. Huang et al., "Intergration of MEMS Inertial Sensor-Based GNC of a UAV". International Journal of Information Technology vol. 11 No. 10 2005. pp. 1-10.

Bandala et al., "Tracking of internal organ motion witha six degree-of-freedom MEMS sensor: concept and simulation study". Meas. Sci. Technol. 19 (2008) 024006 (9pp).

Johnson, et al., "Inertial Navigation for a Mobile Robot Using MEMS Inertial Sensors and a State Estimation Algorithm for Bias Updates," IEEE Transactions on Robotics, 2011.

Johnson, et al., "A Powerful and Inexpensive Method for Calibrating an Inertial Measurement Unit. Part I: Background and Theory," Jan. 2, 2011.

U.S. Appl. No. 13/345,431, Nov. 20, 2014, Office Action.

* cited by examiner

STATE ESTIMATOR FOR REJECTING NOISE AND TRACKING AND UPDATING BIAS IN INERTIAL SENSORS AND ASSOCIATED METHODS

BACKGROUND

1. Field of the Invention

The present invention relates generally to tracking and updating bias in inertial sensor devices.

2. Related Art

Inertial measurement technology has been used since the 1920's in aviation with ballistics and space exploration applications following later in the twentieth century. Throughout this period, a solid knowledge base and sophisticated techniques for inertial measurement have been developed for applications where velocities and distances are measured using nautical miles or even astronomical units. Until recent years, applications better-suited to measurement using meters or millimeters generally did not utilize inertial measurement due to the prohibitive size, weight, and cost of the sensors. The introduction and steady improvement of sensors based on microelectromechanical systems (MEMS) and other small, less-expensive inertial sensors has opened the door to their use in such applications in the past decade.

Strap-down inertial measurement units developed from these new sensors offer several advantages over other position and velocity sensing strategies. Theoretically, acceleration, velocity, position, and orientation information may all be obtained from a single source. This reduces the number of sensors needed and the hardware complexity for the end user. The operation of inertial sensors is self-contained, reducing dependence on outside references, such as global positioning systems (GPS). MEMS inertial sensors are also extremely small and lightweight, with tri-axial accelerometers that occupy as little as 15 mm$^3$ now being available.

Despite these advantages, applications of inertial sensors are still limited due to drawbacks that include bias drift, sensor accuracy, mounting, and calibration issues. Since velocity, position, and orientation are all derived through integration, the results of which are sensitive to all of these potential sources of error, they lead to unbounded error growth if outside references are unavailable.

SUMMARY OF THE INVENTION

The present invention provides methods and systems for tracking and updating bias in an inertial sensor. In one aspect, for example, a method for updating bias in a sensor during an extended period of periodic motion is provided. Such a method can include determining a maximum bias drift and a noise band for a sensor, determining a prior bias value of the sensor, and measuring a current bias value of the sensor. The method can further include calculating a bias difference between the prior bias value and the current bias value, and updating the prior bias value with the current bias value if the current bias value is within the noise band and the bias difference is less than or equal to the maximum bias drift. In one aspect, updating the bias value occurs in real time. In another aspect, updating the bias value occurs in real time during gait motions of a subject.

In another aspect, a method for tracking and updating bias in a sensor during an extended period of periodic motion can include determining a maximum bias drift and a noise band for a sensor, retrieving a prior bias value from a memory location functionally associated to the sensor, and obtaining a current bias value from the sensor. The method can further include calculating a bias difference between the prior bias value and the current bias value with an electronic processor functionally coupled to the memory location, and updating the prior bias value with the current bias value if the current bias value is within the noise band and the bias difference is less than or equal to the maximum bias drift. The updated prior bias value can subsequently be stored in the memory location.

Additionally, in some aspects data from the sensor can be filtered prior to updating the prior bias value. In one specific aspect, the data from the sensor can be low-pass filtered prior to updating the prior bias value. In another specific aspect, the data from the sensor can be low-pass filtered with a cutoff frequency that is below a dominant noise frequency.

The present invention additionally provides a system for updating bias in a sensor during an extended period of periodic motion. Such a system can include a sensor, an electronic processor functionally coupled to the sensor and capable of analyzing bias data from the sensor as is described above, and a memory device functionally coupled to the electronic processor and capable of receiving and storing data from the electronic processor. In one specific aspect, the system can further include an electronic view screen functionally coupled to the electronic processor and capable of displaying data derived from the sensor. In another specific aspect, the system can further include an electronic input device capable of interaction with the electronic processor. Additionally, in one specific aspect, the sensor, the electronic processor, and the memory device can be contained in a shoe.

In another aspect, the sensor can be an accelerometer, a gyroscope, or a combination thereof. Additionally, multiple gyroscopes and/or accelerometers can be utilized.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENT(S)

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

The inventors have developed a state estimation algorithm for rejecting noise and tracking and updating bias in both real-time and post-processing applications of inertial measurement for intermittent motion. The algorithm uses characteristics of sensor noise to automatically recognize motionless periods and update the sensor's bias level without any dependency on application-specific parameters, frequency separation between the signal of interest and the sensor noise, or a high-level system model. Accumulated error in the velocity estimate is eliminated during periods of rest, thus allowing useful velocity estimates to be obtained for arbitrarily long periods given reasonably frequent pauses in the motion. This significantly extends the length of time over which useful position estimates are obtained, especially for post-processing applications. It should be noted that, although much of the following discussion pertains to inertial measurements, the teachings outlined herein can be used to reject noise and/or track bias drift for any signal where zero level inputs occur intermittently and limits can be set on the noise amplitude, frequency, and bias drift.

The present invention thus provides techniques that allow estimation of the bias level of a sensor such as an accelerometer and the derived velocity estimate during intermittent motion. It should be noted that such estimations can occur in real-time or post-processing. More generally, the techniques provide real-time or post-processing noise rejection and bias level estimation in a signal where zero level inputs occur intermittently and the noise frequency, amplitude, and drift rate can be determined.

The state estimation technique presented herein depends on periods of zero acceleration and in some cases zero velocity to update the corresponding bias estimates and correct drift. However, pauses in motion need only last a few tenths of a second for bias corrections to occur, and the algorithm depends solely on easily measured characteristics of the sensor. This eliminates the need for empirically derived, application-specific parameters and thresholds, which can in some cases, be difficult to define and tune.

A variety of applications are contemplated that could benefit from the various aspects of the present invention, and as such, those specific applications described herein should not be seen as limiting. With that being said, applications that offer relatively frequent motion pauses are particularly useful. Non-limiting examples of such applications can include mobile robots with short cruising periods, end effectors of stationary robots, head tracking systems for virtual reality, general human motion tracking such as gait analysis, movements made by the upper limbs, head, and torso that are typically non-continuous during stationary activities or those involving intermittent locomotion, and the like.

Two exemplary applications that could benefit from the advantages offered by bias tracking include human motion tracking and the instrumentation of a robot, for instance an ornithopter (an avian-inspired flapping robot) for flight control. Both of these applications involve motion at relatively low velocities over short distances. Because of this, GPS systems are of very limited utility in these and similar applications due to the small range of motion, low speeds, and signal blockage problems associated with indoor environments. Both applications also present limits on the amount of information that can be obtained through a system model. In human motion tracking, for example, a measurement unit could be strapped to any location on the body and experience a wide variety of motions. For the ornithopter, disturbances caused by even a slight breeze can readily exceed the force generated by the vehicle itself requiring accurate detection of and compensation for unanticipated motions.

The techniques described herein allow motionless periods to be automatically recognized and quickly acted upon without the need for a motion-control program to signal that motion has ceased. Such a system can be important for applications where such high-level knowledge of motion is often unavailable, such as is often the case with human motion. The algorithm that is central to these methods and systems is designed for real-time implementation using minimal data storage. However, the algorithm can be used in post-processing applications. In such applications, interpolating the bias level between adjustments offers increased accuracy in velocity and position estimates.

Figure 1:
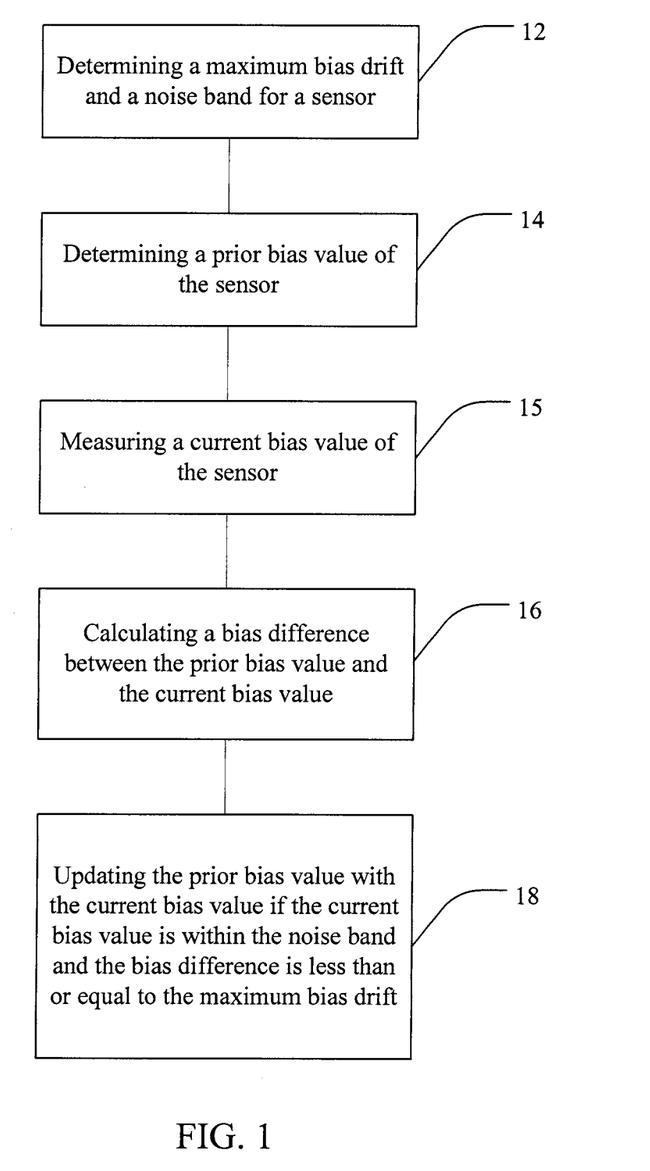
FIG. 1 is a flow chart depicting a method for tracking and updating bias in a sensor during an extended period of periodic motion in accordance with an embodiment of the present invention.

Accordingly, in one aspect as is shown in FIG. 1, the present invention provides a method for tracking and updating bias in a sensor during an extended period of periodic motion. The method can include determining a maximum bias drift and a noise band for a sensor 12, determining a prior bias value of the sensor 14, and measuring a current bias value of the sensor 15. The method can also include calculating a bias difference between the prior bias value and the current bias value 16, and updating the prior bias value with the current bias value if the current bias value is within the noise band and the bias difference is less than or equal to the maximum bias drift 18.

Maximum bias drift and the noise band can be measured a priori for the particular sensor being used. It should be understood that the maximum bias drift can be described and/or measured in different ways according to the methods being used in the bias evaluation. For example, in one aspect the maximum bias drift can be a maximum bias drift rate defined as the maximum change in bias per unit time. In another aspect, the maximum bias drift can be the maximum drift in the bias that can occur during a given period of time.

Knowing how fast the bias can drift allows the creation of a linearly growing envelope that corresponds to a bounded region representing the maximum distance the bias level can drift for a given time period. In other words, a signal drift of a sensor signal that is within the bounded region is more consistent with bias drift for that signal rather than acceleration. Thus, if the signal is recognized as being within the noise band, and the average value is within the region that is determined by the maximum bias drift, then the bias level is updated. Otherwise, it is assumed that there is a constant acceleration being measured and the bias estimate (or prior bias value) is left unchanged. Accordingly, when the sensor signal matches the known characteristics of the signal noise and variations from the prior bias value are less than or equal to what could be accounted for by the bias drift of the sensor, it is assumed that the sensor is not experiencing acceleration, or that any acceleration that is occurring is smaller than what is detectable by the sensor.

Various methods can be utilized to calculate the bias difference between the prior bias value and the current bias value. In one aspect, such a calculation can be accomplished by obtaining the current bias value and the prior bias value, and taking the difference between the two. The elapsed time between the current bias value and the prior bias value can then be used to calculate the rate of change or the magnitude of change of the bias between the two points. If this rate of change is less than the maximum drift of the sensor, the bias level (prior bias value) can be updated to the current bias value.

In another aspect, the elapsed time between the prior bias value and the current bias value is determined and multiplied by the maximum drift of the sensor to define the result as the limit of how far the bias can drift given the elapsed time. The difference between the current bias value and the prior bias value is then determined and compared to this calculated limit. If the difference is less than or equal to the calculated limit, the bias can be updated.

It is important to note that, while the discussion herein is directed to sensors measuring acceleration, the same principles apply to sensors measuring velocity, for instance a gyroscope measuring angular velocity, or estimates of velocity derived from integration of acceleration. In other words, a sensor measuring velocity or a velocity estimate can be bias updated during periods where the signal from such a sensor or estimate is within the noise band and has drifted less than the maximum drift during a given time period. Furthermore, acceleration and velocity sensors or estimates can be updated independently from one another; there is no limit on the number of sensors or estimates that can be updated.

Figure 2:
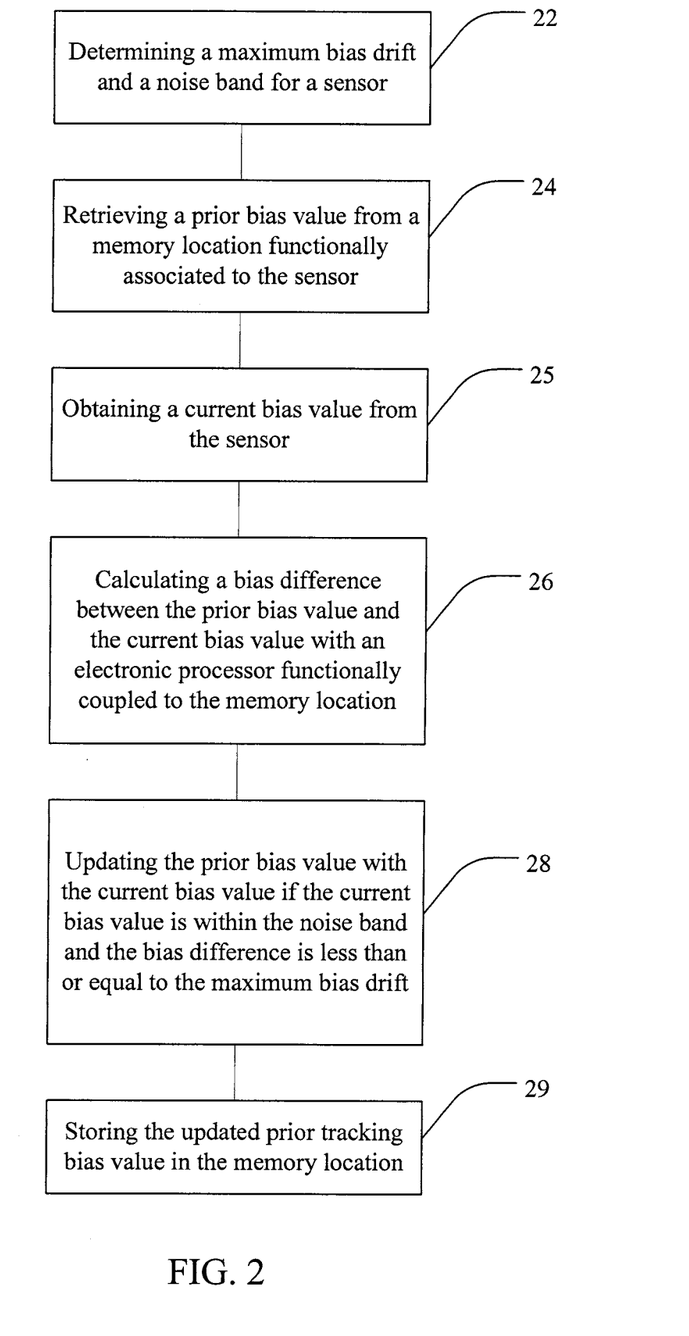
FIG. 2 is a flow chart depicting a method for tracking and updating bias in a sensor during an extended period of periodic motion in accordance with an embodiment of the present invention.

In a more specific aspect, as is shown in FIG. 2, a method for tracking and updating the bias of a sensor during an extended period of periodic motion can include determining a maximum bias drift and a noise band for a sensor 22, retrieving a prior bias value from a memory location functionally associated to the sensor 24, and obtaining a current bias value from the sensor 25. The method further includes calculating a bias difference between the prior bias value and the current bias value with an electronic processor functionally coupled to the memory location 26, updating the prior bias value with the current bias value if the current bias value is within the noise band and the bias difference is less than or equal to the maximum bias drift 28, and storing the updated prior bias value in the memory location 29.

Figure 3:
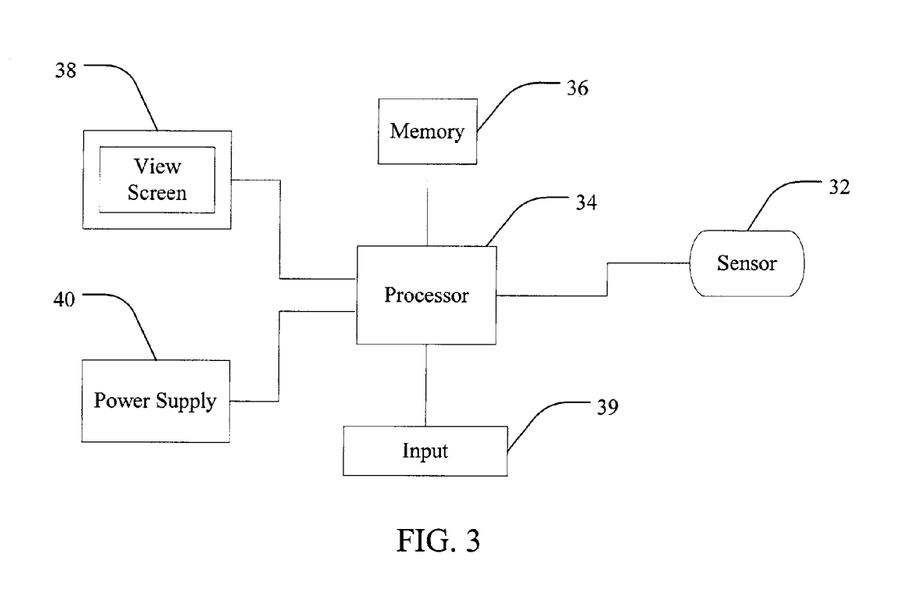
FIG. 3 is a schematic diagram of a system for tracking and updating bias in a sensor during an extended period of periodic motion in accordance with an embodiment of the present invention.

The present invention additionally provides systems for tracking and updating bias as is discussed herein. As is shown in FIG. 3, such a system can include a sensor 32 or other sensor, and an electronic processor 34 that is functionally coupled to the sensor 32, and is capable of analyzing bias data from the sensor 32 as has been described. The system also includes a memory device 36 that is functionally coupled to the electronic processor 34 and capable of receiving and storing data from the electronic processor 34. In one specific aspect the system can further include a shoe (not shown) that contains the sensor 32, the electronic processor 34, and the memory device 36. Additionally, in one aspect the system can include an electronic view screen 38 functionally coupled to the electronic processor 34 and capable of displaying data derived from the sensor 32. In another aspect, the system can also include an electronic input device 39 capable of interaction with the electronic processor 34.

A power supply 40 can additionally be incorporated into the system to power the various components described. It should be noted that a single power supply can be used to power all of the components of the system, or multiple power supplies can be employed.

As has been described, the system can be incorporated into a shoe or shoes. The terms "shoe" and "shoes" are used broadly herein to mean any footwear, whether commercially available or custom made for carrying the sensors, such as shoes, sneakers, boots, sandals, slippers, athletic footwear, socks, prosthetic foot or shell of a prosthetic foot, etc. The electronic processor can be located within the shoe, or it can be located remotely and functionally coupled thereto by a physical tether or other wireless means.

The prior bias value is stored in a memory location for later retrieval for comparison with the current bias value. It should be noted that the memory location described can be a single memory location or register, or it can be multiple memory locations or registers. Additionally, the memory location can be any type of memory capable of storing the tracking data, as would be understood by one of ordinary skill in the art. Thus the prior bias value can be retrieved from the memory location and compared to the current bias value to calculate the bias difference between the two. This calculation can be accomplished with the electronic processor that is functionally coupled to the memory location. It should be noted that functionally coupled can include electrical coupling and wireless coupling. The prior bias value can then be updated with the current bias value if the current bias value is within the noise band and the bias difference is less than or equal to the maximum bias drift. In other words, the value for the previous data point (i.e. the prior bias value) can be updated with the bias value of the signal at the current data point (i.e. the current bias value). Thus if the signal from the sensor is within the noise band and the bias drift in the signal between the previous data point and the current data point is less than the maximum bias drift of the sensor, then the bias value is updated. If either of these conditions is not met, then the bias value is not updated.

EXAMPLES

Experimental Setup

Equipment

A 1.7 g Analog Devices ADXL203 MEMS two axis accelerometer is used in the following experiments. A 5 V power supply is used giving a nominal scale factor of 1000 mV/g. The value of the scale factor for this power supply typically varies by less than 2%. Given this level of accuracy in the scale factor calibration, the nominal value is assumed correct. 100 nF filtering capacitors are used to set the nominal bandwidth of the sensor output at 50 Hz and the nominal noise floor at 1.0 mg rms (1.0 mV rms), with a peak-to-peak noise estimate of 6 mg (6 mV).

A THK linear bearing rail and slider are used to constrain motion to one dimension and allow the data processing to focus solely on sensor-level noise rejection and bias estimation without the additional complications of higher dimensional navigation solutions. It is verified that the precise fit of the slider on the rail constrained their relative motion sufficiently that no measurable changes in the bias level of the sensor could be produced by misalignment between the two. The rail is approximately 800 mm long and is mounted horizontally atop two boards that are nearly coplanar, but which introduce slight changes in tilt from one end to the other. The maximum variation in tilt along the direction of motion is approximately 0.5°. This variation is large enough to cause measurable changes in the zero level, or bias, of the accelerometer, but small enough that the impact on the scale factor in the direction of motion is negligible. The variation is used to partially simulate the errors in knowledge of the direction of gravity that result when using a gyroscope to track orientation or other conditions that can cause uncertainty in the bias level of the sensor to accumulate faster than by natural drift.

A six-camera Vicon 460 vision system is used to provide an absolute position reference during the experiments for comparison with the results from the accelerometer. Position information from the cameras is provided at a rate of 120 Hz with an accuracy of approximately ±0.5 mm. The Vicon system also provides synchronization of the accelerometer output and position information through a 16-bit A/D converter that is used with a ±5 V range to sample the sensor output in the direction of motion at 1080 Hz.

Experiments Performed

First, static measurements are taken in order to accurately characterize the overall noise of the measurement system. Dynamic experiments are then performed by moving the slider back and forth by hand. Different speeds are used along with intermittent motionless periods of various durations and frequencies. In all experiments, the sensor is powered up for a period of at least 10 minutes to allow a steady-state operating temperature to be reached and thus avoid bias drift due to transient thermal effects.

Sensor Noise Characterization

Figure 4:
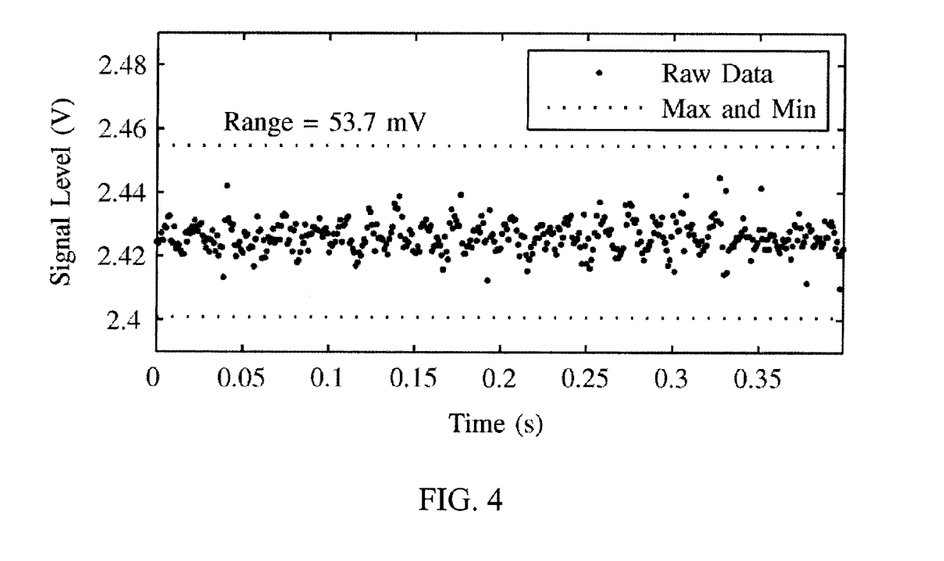
FIG. 4 is an exemplary graph depicting noise during a static test of an accelerometer in accordance with an embodiment of the present invention.
Figure 5:
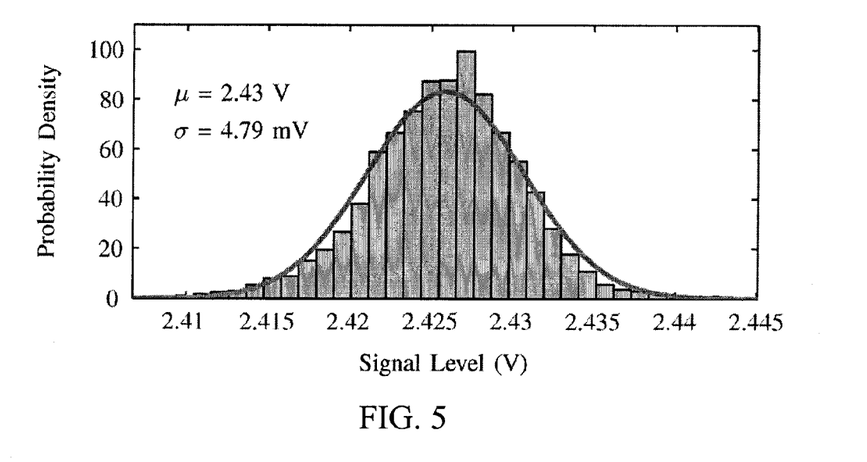
FIG. 5 is an exemplary graph depicting a noise distribution compared to the normal distribution in accordance with an embodiment of the present invention.
Figure 6:
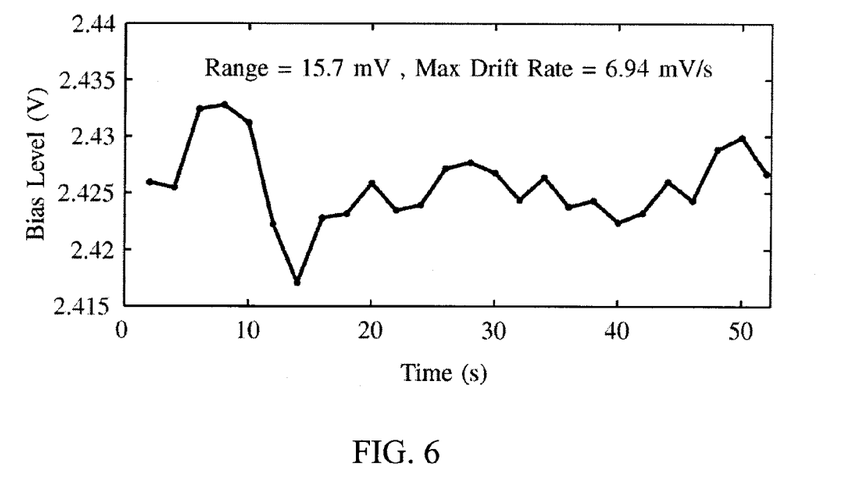
FIG. 6 is an exemplary graph depicting bias drift during a static test of an accelerometer in accordance with an embodiment of the present invention.

Representative data from static measurements of the accelerometer's horizontal axis are shown in FIGS. 4-6. FIG. 4 shows the measurement of noise during a static test of the accelerometer. FIG. 5 shows a noise distribution compared to the normal distribution derived from it mean, $\mu$, and standard deviation, $\sigma$. FIG. 6 shows observed bias drift during a static test of the accelerometer. Each point is the average of the data over the two prior seconds. From the static measurements, the following overall noise characteristics are identified for the measurement system employed:

1) A dominant frequency of 60 Hz.
2) A peak-to-peak amplitude of 53.7 mV and standard deviation of 4.79 mV.
3) A maximum bias level drift rate of 6.94 mV/s. This value is obtained by averaging the data over successive two-second intervals and then finding the maximum rate of change from one average to the next.

These values were found to be reasonably consistent throughout the experiments. They are also in agreement with the values observed for the vertical axis for which the noise was found to have the same dominant frequency, a peak-to-peak amplitude of 48.7 mV, a standard deviation of 4.55 mV, and a maximum drift rate of 5.2 mV/s.

State Estimation Algorithm

Three objectives were utilized in the development of the state estimation algorithm. These were to:

1) Recognize periods where measurement noise dominates any underlying signal to allow the estimate of the sensor's bias level to be updated.
2) Smooth the signal as much as possible without introducing phase lag, overshoot, or otherwise producing errors greater than those already present due to the sensor noise.
3) Minimize processing and data-storage requirements to facilitate using the algorithm in real-time applications.

It should be noted that appropriate data smoothing during periods of non-zero acceleration will have little to no effect on the result of integrating the accelerometer signal to obtain velocity and position estimates. However, it is still useful in that it facilitates the detection of regions where the sensor output is essentially constant, aiding in the first listed objective. Smoothing is also desirable in situations where acceleration is an input to a control algorithm; for example, to produce disturbance force estimates. In such cases, smoothing the accelerometer output will result in smoother control inputs.

Several assumptions can be made in considering a state estimation algorithm. First, an assumption can be made that the noise characteristics observed in the static tests would remain constant throughout the entire measurement range of the sensor under both static and dynamic conditions. Holding to such an assumption, it can be said that:

1) During periods of a constant underlying measurement value, a low-pass filter with a cutoff frequency below the dominant noise frequency could be used to smooth out the noise and recover the true signal value;
2) Any given raw reading should have no more error than one-half the peak-to-peak noise amplitude; and
3) It cannot be determined if changes in the signal level at or below the maximum drift rate of the bias level are due to changes in the underlying signal level, drift, or a combination of both.

These observations set realistic limits on the signals that the sensor is capable of accurately resolving. Any signal that falls entirely inside the peak-to-peak noise amplitude and whose mean changes at a rate equal to or below the maximum drift rate is often indistinguishable from the inherent noise in the sensor output. For convenience, this range of signals is referred to as the sensor's noise band. For the sensor to be used successfully, the application should not require measurements in this range. Therefore, a second assumption is made that the sensor is being used prudently, and if its output does lie within the noise band, it is because the underlying signal value is constant.

Figure 7:
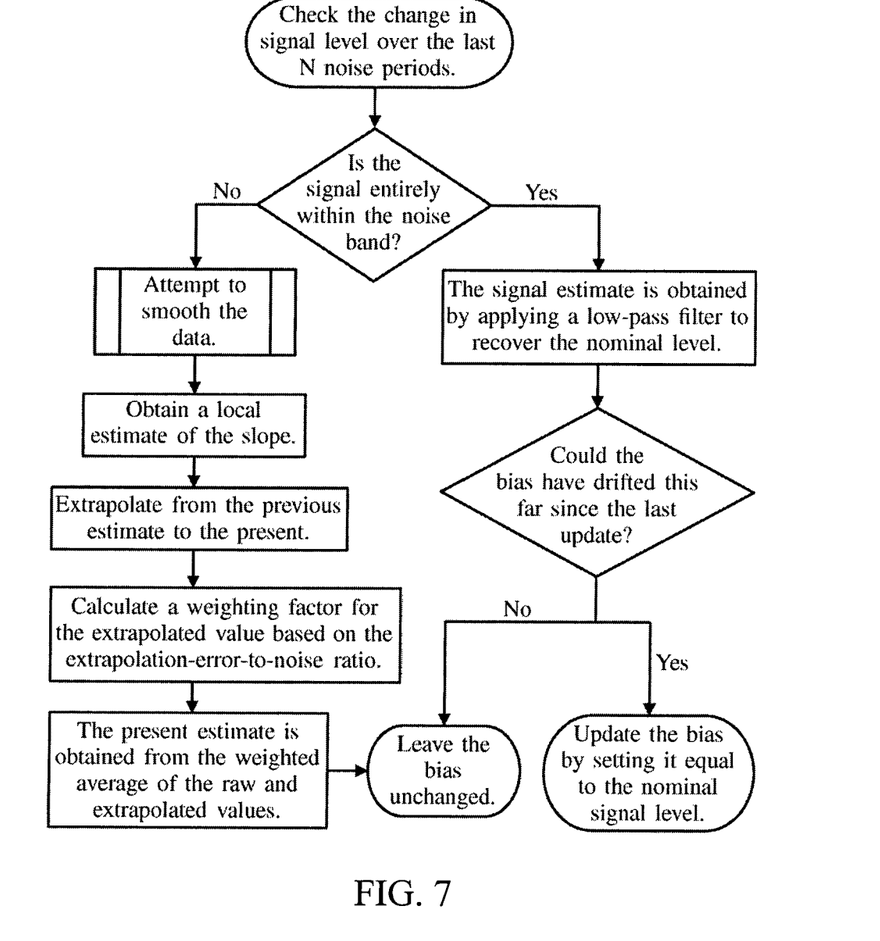
FIG. 7 is an exemplary flowchart of an algorithm for noise rejection and bias estimation in accordance with an embodiment of the present invention.

One example algorithm that can accomplish state estimation as described herein is shown in FIG. 7. It should be noted that this particular aspect of the algorithm should not be seen as limiting, but is intended to be exemplary. That being said, the algorithm can be divided into a noise rejection portion and a noise band recognition and bias estimation portion, each of which will be described in turn.

Regarding the noise rejection portion of the algorithm, to reject noise and smooth the sensor output during periods of measurable acceleration, a prediction/correction approach can be employed. First, the prior filtered data points are used to estimate the slope of the signal and extrapolate to the present data points to predict what the value would be if the signal continued on its previous course. Raw signal values are not used in this prediction step because they are known to contain noise and would thus be expected to corrupt the slope estimates. The method of prediction employed is a first-order extrapolation where the slope is estimated as in Equation (I):

$$m[n] = \frac{1}{4}\sum_{i=1}^{4}\frac{1}{i}(y[n-1]-y[n-1-i]) \quad \text{(I)}$$

where y[n] is the filter output and m[n] is the estimated slope at sample n. This exemplary method of estimating the slope gives a good balance of immunity to small fluctuations in y[n] without introducing so much of the data history that it becomes unresponsive. Given this estimate of the slope, the predicted value, p[n], is found according to Equation (II):

$$p[n]=y[n-1]m[n] \quad \text{(II)}$$

and the ratio of the error between this prediction and the raw sensor reading, x[n], to the peak value (one half the peak-to-peak value) of the noise, $\eta_{max}$, is designated $r_{e/\eta}$ and is defined as in Equation (III):

$$r_{e/\eta} = \frac{|p[n]-x[n]|}{\eta_{max}} \quad \text{(III)}$$

The filtered value is then found from a weighted average of the raw value and the prediction as is described in Equation (IV):

$$y[n]=w(r_{e/\eta})p[n]+[1-w(r_{e/\eta})]x[n] \quad \text{(IV)}$$

where w(•) is a function that weights how much the prediction should be trusted relative to the raw reading and whose range must be restricted to [0, 1] to ensure that y[n] will lie between x[n] and p[n].

To ensure that the smoothing filter does not introduce more error than is already present due to the sensor noise, the limitation of Equation (V) can be followed:

$$|y[n]-x[n]|\leq\eta_{max} \quad \text{(V)}$$

Substituting Equation (IV) into Equation (V) and simplifying gives Equation (VI):

$$w(r_{e/\eta})|p[n]-x[n]|\leq\eta_{max} \quad \text{(VI)}$$

which can further be simplified via Equation (III) to Equation (VII):

$$w(r_{e/\eta}) \leq \frac{1}{r_{e/\eta}} \quad \text{(VII)}$$

Hence the function $w(r_{e/\eta})$ is bounded above by both 1 and $1/r_{e/\eta}$.

Given the above restrictions and the nature of the sensor noise, in one aspect a natural choice for w is that of an unscaled Gaussian distribution of the form as shown in Equation (VIII):

$$w(r_{e/\eta}) = \exp\left(-\frac{r_{e/\eta}^2}{2\sigma^2}\right) \quad \text{(VIII)}$$

This gives a maximum value of 1 when the prediction and raw value are in perfect agreement. This can be viewed as an indication that the weighting function "thinks" the probability the prediction is correct is equal to 1. If there is an error between the predicted and raw values, the function decreases the weight or the probability that the prediction is correct, according to a normal distribution, which was found to be an accurate representation of the sensor noise. The maximum variance that can be used without passing the $1/r_{e/\eta}$ bound is $\sigma^2 \approx 1.6$. This gives the maximum amount of filtering possible for this weighting function while still enforcing Equation (V).

Turning to the noise band recognition and bias estimation portion of the algorithm, when the sensor signal is entirely within the noise band, a low pass filter can be used to estimate the underlying signal value. A simple implementation for the filter is a moving average as is described in Equation (IX):

$$y[n] = \frac{1}{NT_\eta - 1}\sum_{i=0}^{NT_\eta - 1} x[n-i] \quad \text{(IX)}$$

where $T_\eta$ is the number of samples corresponding to the period of the lowest dominant frequency of the sensor noise and N is the number of periods over which the moving average should be taken to ensure that the noise is adequately suppressed. For the accelerometer referenced above, N=6 works well. Thus N must be high enough to smooth the data sufficiently while still being responsive enough to follow potential drift in the bias level.

Since accurate recovery of the average signal value requires averaging samples for N noise periods, the algorithm can wait for the output to be entirely within the noise band for N samples before switching to this mode and using the low-passed values as the filter output. Otherwise, data from a non-stationary signal period will be included in the moving average, thus shifting the result from the present value.

To recognize when the signal is within the noise band, the raw value at sample n is compared against the filtered value at sample $n-NT_\eta$. If the difference is less than the peak noise, then the algorithm computes the average of x[n] over the same range and ensures that none of the deviations between x[n] and this average are greater than the peak noise plus the amount the bias could have drifted over that time given the maximum bias level drift rate of the sensor. If all samples are within this range, then the signal is contained within the noise band and the low-pass filtering mode is initiated. While in this mode, the bias level will be updated if the filtered value is within the range to which the bias level could have drifted since it was last update given its maximum drift rate. For sensors where the bias level is known to stay within certain bounds, these can also be taken into account when deciding if the bias should be adjusted.

One consideration is that if the bias level is updated during a stationary period whose duration is extremely short, the resulting value may not be sufficiently accurate. To prevent this without having to extend the length of the moving average filter, a delay of a specified number of noise periods can be added between the time when the signal is recognized as having entered the noise band and the time when bias adjustment begins. In one aspect, using a delay of two noise periods could be sufficient.

Experimental Results

The data shown in this section are from a thirty-second trial in which the slider is moved somewhat randomly with varying velocities. Motionless periods are introduced roughly every three seconds so that every two seconds of motion were followed by one second of rest, on average. Similar results are obtained in ten additional trials.

Figure 8:
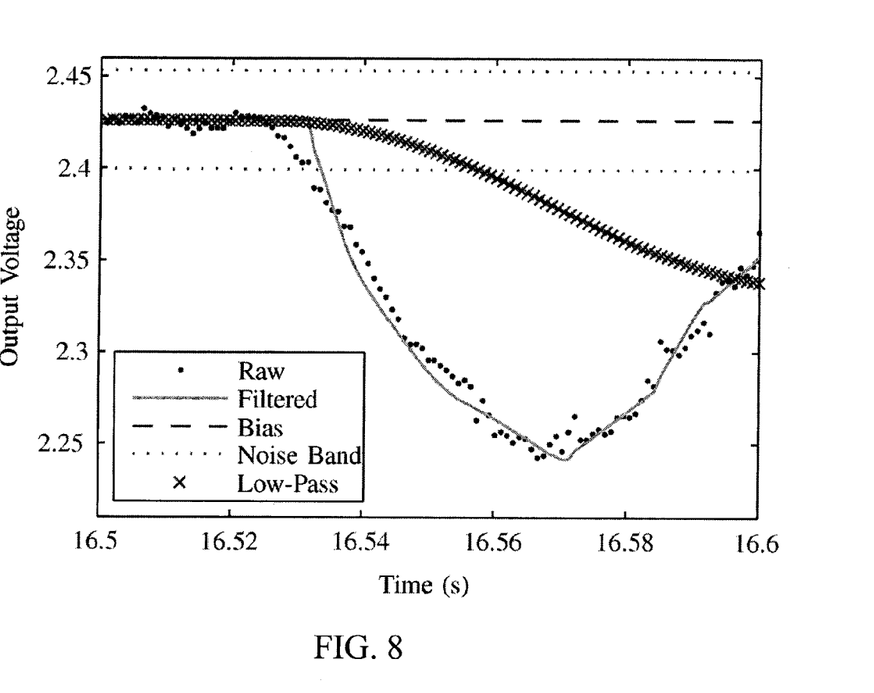
FIG. 8 is an exemplary graph depicting various data smoothing procedures in accordance with an embodiment of the present invention.

The results of applying the state estimator to the raw accelerometer voltage output are shown for a representative time interval in FIG. 8. The beginning of the interval is during a motionless period where the algorithm has identified the signal as being entirely within the noise band and applied the low-pass filter to recover the nominal signal level. This level is within the range to which the bias could have drifted since the last update, so it is updated during this period.

The latter portion of the plot shows that as the signal exits the noise band, the state estimator responds quickly and begins to use the prediction/correction smoothing technique instead of the low-pass filter. The plot shows that the technique is successful in smoothing the signal by rejecting variations that are recognizable as noise. It does this without introducing any significant phase errors regardless of the frequency components of the motion because of the formulation of the weighting coefficient given by Equation (IIIV). For comparison, the result that would be obtained if the low-pass filter were used exclusively to process the data is shown. This illustrates the large amount of phase lag that would result due to the low cutoff frequency that is necessary to smooth the signal adequately while it is inside the noise band.

Figure 9:
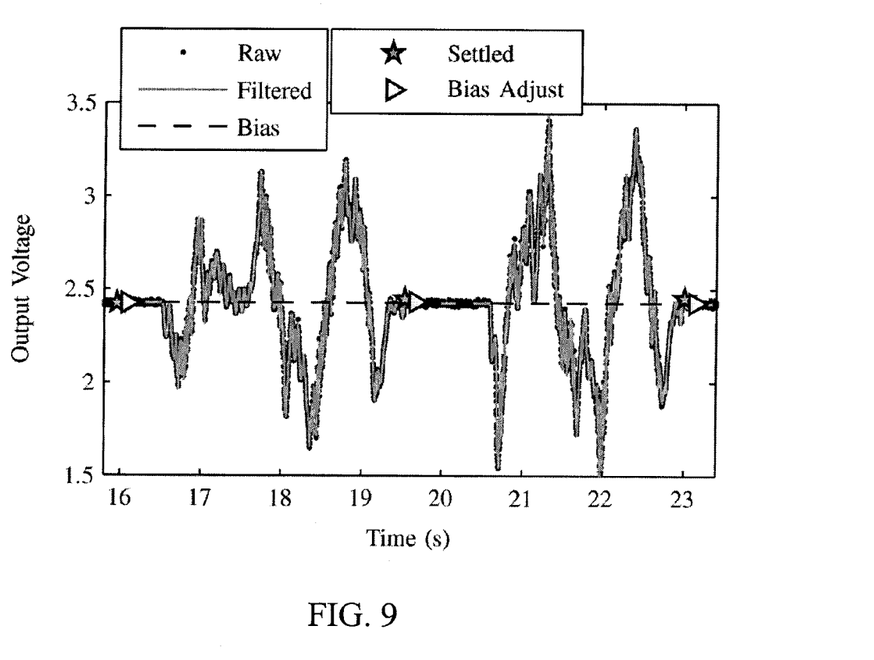
FIG. 9 is an exemplary graph depicting noise band recognition and the beginning of bias adjustment periods for raw accelerometer data in accordance with an embodiment of the present invention.

The state estimator's function of recognizing periods where the signal is entirely within the noise band is illustrated in FIG. 9. When the signal is recognized as having entered the noise band, it is marked as being settled. After remaining settled for the designated number of noise periods, bias level adjustment begins if the signal is within the possible range of drift since the prior update. For the chosen parameters and the noise characteristics of the experimental setup, the delay between settling into the noise band and the beginning of bias adjustment is 0.133 seconds. The algorithm can reliably recognize and use a stationary period of this short duration to update the bias level of the sensor.

Figure 10:
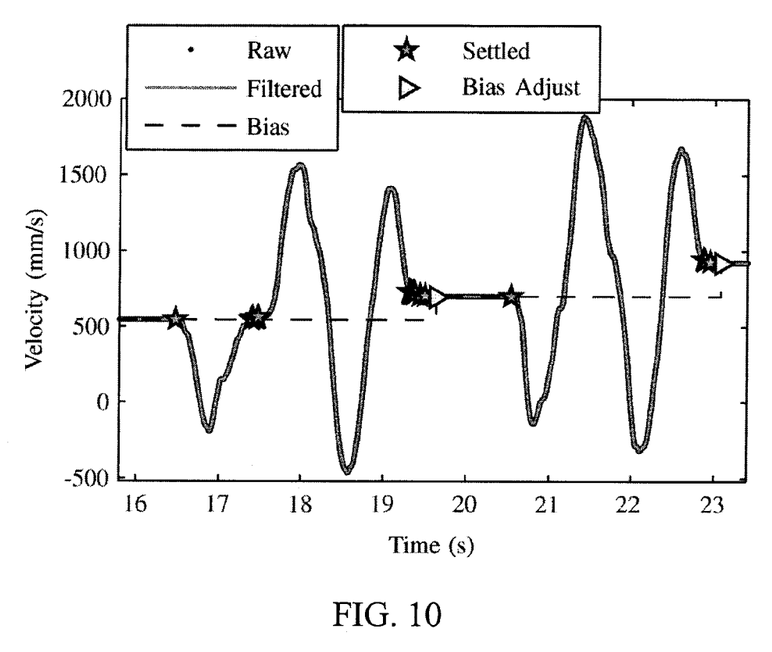
FIG. 10 is an exemplary graph depicting noise band recognition and bias adjustments for the velocity estimate obtained by integration of processed accelerometer data in accordance with an embodiment of the present invention.

In a real-time application, each new estimate of the bias level could be used throughout the next period of motion. Proceeding in this fashion and integrating to obtain the velocity estimate, it is found to have a strong drift rate during periods of motion in these experiments. The integrated velocity data are examined allowing identification of a noise amplitude, frequency, and maximum drift rate. Using these noise characteristics, the state estimator is applied to the integrated velocity signal to allow its bias level to be estimated. This could also be done in real-time and the result that would be obtained for the same representative time interval is shown in FIG. 10.

Figure 11:
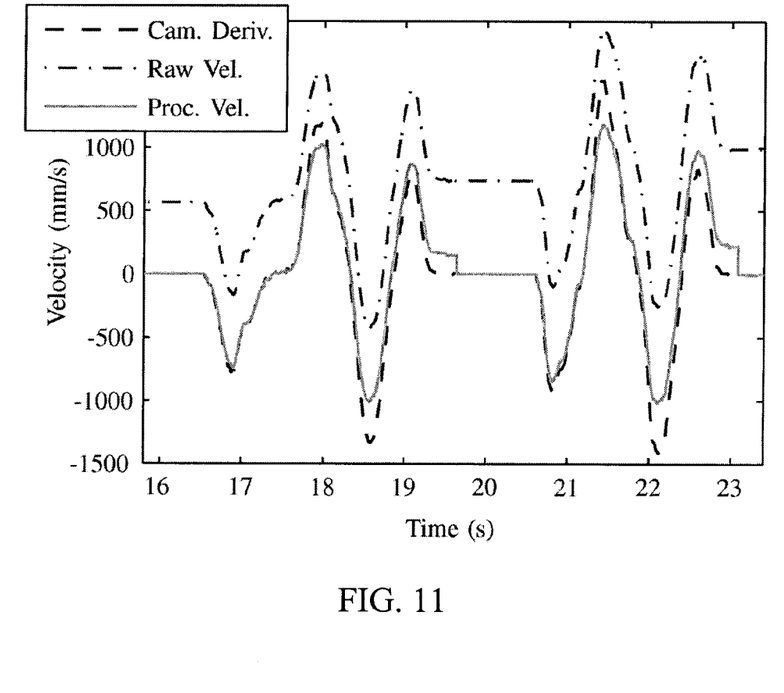
FIG. 11 is an exemplary graph depicting a comparison of the velocity estimates derived from accelerometer data with and without bias correction to a reference provided by a camera system in accordance with an embodiment of the present invention.

For the velocity estimate, a relatively high maximum drift rate is found (150 mm/s/s). This results in the signal being identified as having settled into the noise band in several unexpected places, but it does not remain there long enough for bias adjustment to begin. This illustrates that when drift rates are high, it becomes ever more difficult to distinguish between meaningful signals and changes due to a potentially drifting bias level. Shifting the velocity estimate by the updated bias level each time it is revised during a motionless period provides significant improvements over the original estimate obtained with bias corrections for the acceleration only. This is shown in FIG. 11. The velocity reference obtained by numerically differentiating the data from the vision system is also shown to provide a standard for comparison.

Figure 12:
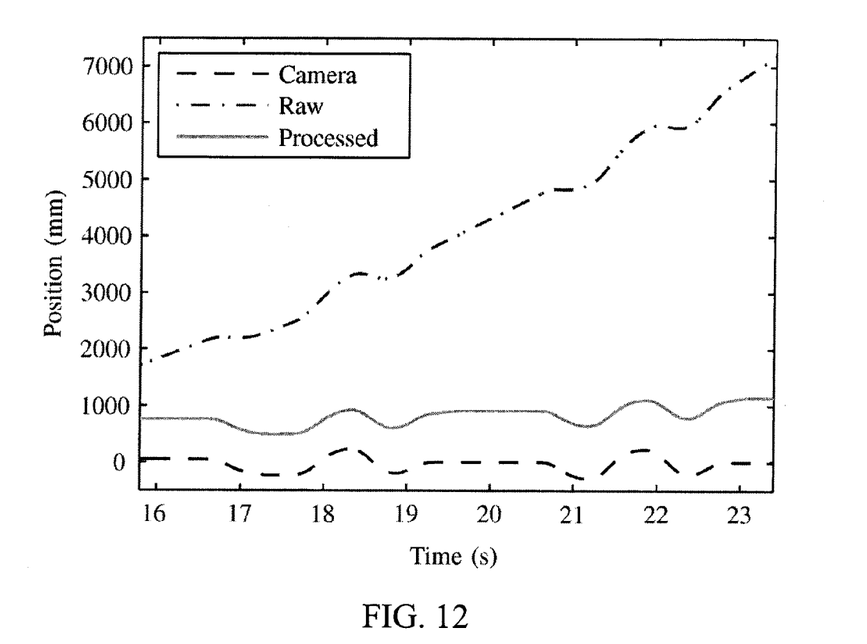
FIG. 12 is an exemplary graph depicting a comparison of position estimates derived from accelerometer data using the velocity estimate with and without bias correction to a reference provided by a camera system in accordance with an embodiment of the present invention.

The position estimate found by integrating the velocity data with and without velocity bias correction is shown in FIG. 12. At the end of the displayed interval, the error without velocity bias correction is 7065 mm. With velocity bias correction, the error is reduced to 1130 mm. While still sizable, this is an 84% reduction. Note that the accelerometer-based quantities do not start at zero because the data shown are taken from the middle of the experiment where the differences in the outcome of the two processing methods are more apparent.

In post-processing applications, additional improvements to both the position and velocity estimates may be obtained by linearly interpolating the bias level of both the acceleration and the velocity estimate between the beginning and end of consecutive adjustment periods. The result of using this interpolation approach for the velocity estimate is shown for the entire trial period in FIG. 13. The position estimate obtained by integrating the post-processed velocity estimate is shown for the entire trial period in FIG. 14. The maximum error observed is only 65 mm compared to a total distance traveled of 8474 mm.

Figure 13:
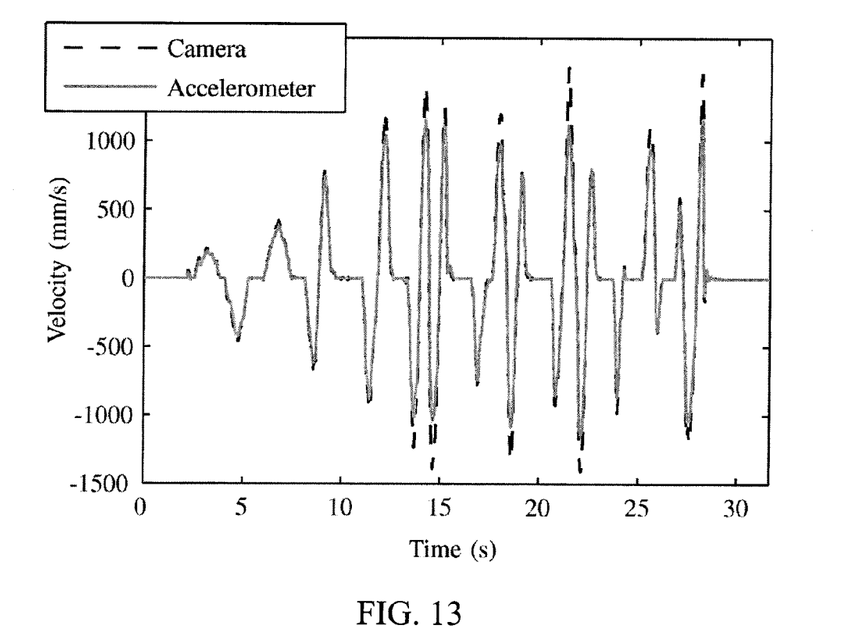
FIG. 13 is an exemplary graph depicting a velocity estimate derived from accelerometer data using post-processing techniques compared to a reference provided by a camera system in accordance with an embodiment of the present invention.
Figure 14:
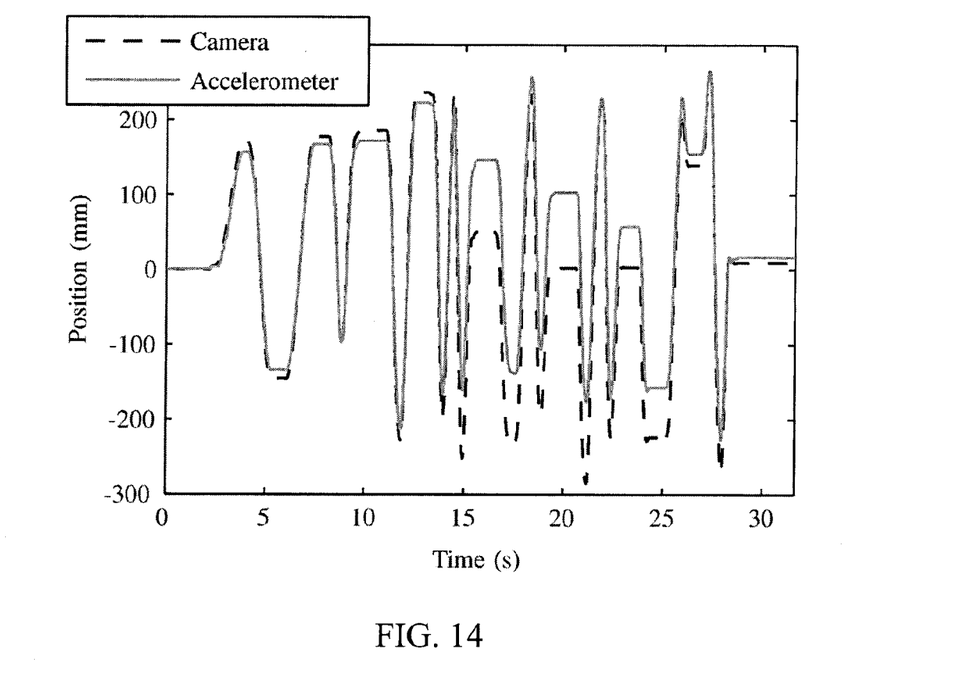
FIG. 14 is an exemplary graph depicting a position estimate derived from accelerometer data using post-processing techniques compared to a reference provided by a camera system in accordance with an embodiment of the present invention.

Using these techniques, substantially all of the error is eliminated from the velocity estimate even during extended periods of motion, as seen in FIG. 13. In such cases, the position estimate can also remain useful over surprisingly long periods of time as seen in FIG. 14.

For real-time applications, the results presented above illustrate that the benefits offered by the techniques of the present invention depend on the frequency of motionless periods. During periods of motion, bias corrections cannot be made and velocity and position errors grow linearly and quadratically with time, respectively. Resulting drift in the position estimate is never corrected, but it is halted during motionless periods and its growth rate is reset to zero. Since velocity error is eliminated during pauses, the velocity estimate can remain useful through arbitrarily long periods of time by ensuring that pauses occur with sufficient frequency to prevent the error from becoming too large for the estimate to be of value. Once the typical velocity bias drift rate has been established, the necessary frequency of pauses needed to avoid exceeding a specified error in the velocity estimate can be determined.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. A method for tracking and updating bias in a sensor during an extended period of periodic motion in order to improve operational accuracy of the sensor, comprising:
   determining a maximum bias drift for a sensor, the maximum bias drift comprising a maximum amount of drift in bias that is permitted to occur during a specified amount of time, such that when the maximum bias drift is exceeded, the maximum bias drift determination prevents bias values from being updated in the sensor;
   determining a noise band for the sensor;
   determining a prior bias value of the sensor;
   measuring a current bias value of the sensor;

calculating by a processor a bias difference between the prior bias value and the current bias value; and updating the prior bias value with the current bias value upon determining that the current bias value is within the noise band and that the bias difference is less than or equal to the determined maximum bias drift, the updating the prior bias value with the current bias value thereby eliminating accumulated error to improve the operational accuracy of the sensor.

2. The method of claim 1, wherein determining the prior bias value includes determining the prior bias value of the sensor and storing the prior bias value in a memory location associated with the sensor.

3. The method of claim 1, wherein updating the prior bias value further includes:

retrieving the prior bias value from the memory location;

calculating the bias difference between the prior bias value and the current bias value with an electronic processor functionally coupled to the memory location;

updating the prior bias value with the current bias value if the current bias value is within the noise band and the bias difference is less than or equal to the maximum bias drift; and storing the updated prior bias value in the memory location.

4. The method of claim 1, wherein the sensor is a member selected from the group consisting of accelerometers, gyroscopes, and combinations thereof.

5. The method of claim 1, wherein the noise band is measured as peak-to-peak amplitude.

6. The method of claim 1, wherein updating the bias value occurs in real time.

7. The method of claim 1, wherein updating the bias value occurs in real time during gait motions of a subject.

8. The method of claim 1, wherein data from the sensor is filtered prior to updating the prior bias value.

9. The method of claim 1, wherein data from the sensor is low-pass filtered prior to updating the prior bias value.

10. The method of claim 9, wherein the data from the sensor is low-pass filtered with a cutoff frequency that is below a dominant noise frequency.

11. The method of claim 1, wherein determining a maximum bias drift and a noise band for the sensor is performed at room temperature.

12. A system for tracking and updating bias in a sensor during an extended period of periodic motion in order to improve operational accuracy of the sensor, comprising:

a sensor;

an electronic processor functionally coupled to the sensor; and a memory device functionally coupled to the electronic processor and capable of receiving and storing data from the electronic processor, wherein the memory device has computer executable instructions stored thereon that when executed by the electronic processor, cause the electronic processor to perform the following:

determine a maximum bias drift for the sensor, the maximum bias drift comprising a maximum amount of drift in bias that is permitted occur during a specified amount of time, such that when the maximum bias drift is exceeded, the maximum bias drift determination prevents bias values from being updated in the sensor, determine a noise band for the sensor, determine a prior bias value of the sensor, measure a current bias value of the sensor, calculate a bias difference between the prior bias value and the current bias value, and update the prior bias value with the current bias value upon determining that the current bias value is within the noise band and that the bias difference is less than or equal to the determined maximum bias drift, thereby eliminating accumulated error to improve the operational accuracy of the sensor.

13. The system of claim 12, further comprising a shoe, wherein the shoe contains the sensor, the electronic processor, and the memory device.

14. The system of claim 12, further comprising an electronic view screen functionally coupled to the electronic processor and capable of displaying data derived from the sensor.

15. The system of claim 12, further comprising an electronic input device capable of interaction with the electronic processor.

16. A method for tracking and updating bias of a sensor during an extended period of periodic motion in order to improve operational accuracy of the sensor, comprising:

determining a maximum bias drift for a sensor, the maximum bias drift comprising a maximum amount of drift in bias that is permitted occur during a specified amount of time, such that when the maximum bias drift is exceeded, the maximum bias drift determination prevents bias values from being updated in the sensor;

determining a noise band for the sensor;

retrieving a prior bias value from a memory location functionally associated to the sensor;

obtaining a current bias value from the sensor;

calculating a bias difference between the prior bias value and the current bias value with an electronic processor functionally coupled to the memory location;

replacing the prior bias value with the current bias value upon determining that the current bias value is within the noise band and that the bias difference is less than or equal to the determined maximum bias drift, the replacing the prior bias value with the current bias value thereby eliminating accumulated error to improve the operational accuracy of the sensor; and storing the updated prior bias value in the memory location.

17. The method of claim 16, wherein data from the sensor is electronically filtered prior to updating the prior bias value.

18. The method of claim 16, wherein data from the sensor is low-pass filtered prior to updating the prior bias value.

19. The method of claim 18, wherein the data from the sensor is low-pass filtered with a cutoff frequency that is below a dominant noise frequency.

20. The method of claim 16, wherein updating the bias value occurs in real time.

21. The method of claim 16, wherein updating the bias value occurs in real time during gait motions of a subject.

* * * * *